United States Patent
Liao et al.

(10) Patent No.: US 9,451,735 B2
(45) Date of Patent: Sep. 20, 2016

(54) SCREW ASSEMBLING DEVICE

(71) Applicants: SHENZHEN FUTAIHONG PRECISION INDUSTRY CO., LTD., Shenzhen (CN); FIH (Hong Kong) Limited, Kowloon (HK)

(72) Inventors: Guo-Sheng Liao, New Taipei (TW); Cheng-Shou Dong, Shenzhen (CN); Zi-Yang Li, Shenzhen (CN); Guang-Hong Wang, Shenzhen (CN)

(73) Assignees: SHENZHEN FUTAIHONG PRECISION INDUSTRY CO., LTD., Shenzhen (CN); FIH (Hong Kong) Limited, Kowloon (HK)

( * ) Notice: Subject to any disclaimer, the term of this patent is extended or adjusted under 35 U.S.C. 154(b) by 344 days.

(21) Appl. No.: 13/966,692

(22) Filed: Aug. 14, 2013

(65) Prior Publication Data
US 2014/0053396 A1    Feb. 27, 2014

(30) Foreign Application Priority Data
Aug. 24, 2012   (CN) .......................... 2012 1 0303975

(51) Int. Cl.
  *B23P 19/00*   (2006.01)
  *H05K 13/02*   (2006.01)
  *B23P 19/06*   (2006.01)

(52) U.S. Cl.
  CPC ............ *H05K 13/02* (2013.01); *B23P 19/001* (2013.01); *B23P 19/06* (2013.01); *Y10T 29/53265* (2015.01)

(58) Field of Classification Search
  CPC ..... B23P 19/004; B23P 19/06; B23P 19/066; B23P 23/00; H05K 13/0023; H05K 13/0053; H05K 13/0069; H05K 13/0084; H05K 13/021; Y10T 29/5313; Y10T 29/53174; Y10T 29/53265; Y10T 29/53417
  USPC .......................................................... 29/760
  See application file for complete search history.

(56) References Cited

U.S. PATENT DOCUMENTS

| | | | |
|---|---|---|---|
| 5,855,151 A * | 1/1999 | Habermehl | 81/434 |
| 6,123,244 A * | 9/2000 | Huang | 227/119 |
| 6,431,036 B1 * | 8/2002 | Obermeier | 81/434 |
| 2004/0064931 A1 * | 4/2004 | Albrecht et al. | 29/428 |

* cited by examiner

*Primary Examiner* — Paul D Kim
(74) *Attorney, Agent, or Firm* — Zhigang Ma (57) ABSTRACT

An screw assembling device includes a supplying mechanism, a securing mechanism, a driving mechanism, and an assembling mechanism. The supplying mechanism supplies a number of screws sequentially. The securing mechanism holds a housing of an electronic device. The assembling mechanism is connected to the supplying mechanism and the driving mechanism. The assembling mechanism is driven by the driving mechanism to predetermined positions of the housing of electronic device and is configured for assembling the plurality of screws transmitted from the supplying mechanism to the predetermined positions of the housing of electronic device.

15 Claims, 7 Drawing Sheets

SCREW ASSEMBLING DEVICE

BACKGROUND

1. Technical Field

The present disclosure relates to a device for assembling workpieces, especially to a device for automatically assembling screws into a workpiece, such as an electronic device.

2. Description of Related Art

Housings of electronic devices, such as mobile phones, personal digital assistants (PDAs), and laptop computers need to be assembled with screws to secure components. The screws need to be screwed in predetermined positions of the housing in assembly. However, the screws are small in size, which makes them hard to hold and position manually. In addition, the amount of screws to be assembled is great, which costs a lot of time. Therefore, an automatic way of assembling the screws is very necessary.

BRIEF DESCRIPTION OF THE DRAWINGS

Many aspects of the disclosure can be better understood with reference to the following figures. The components in the figures are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Figure 1:
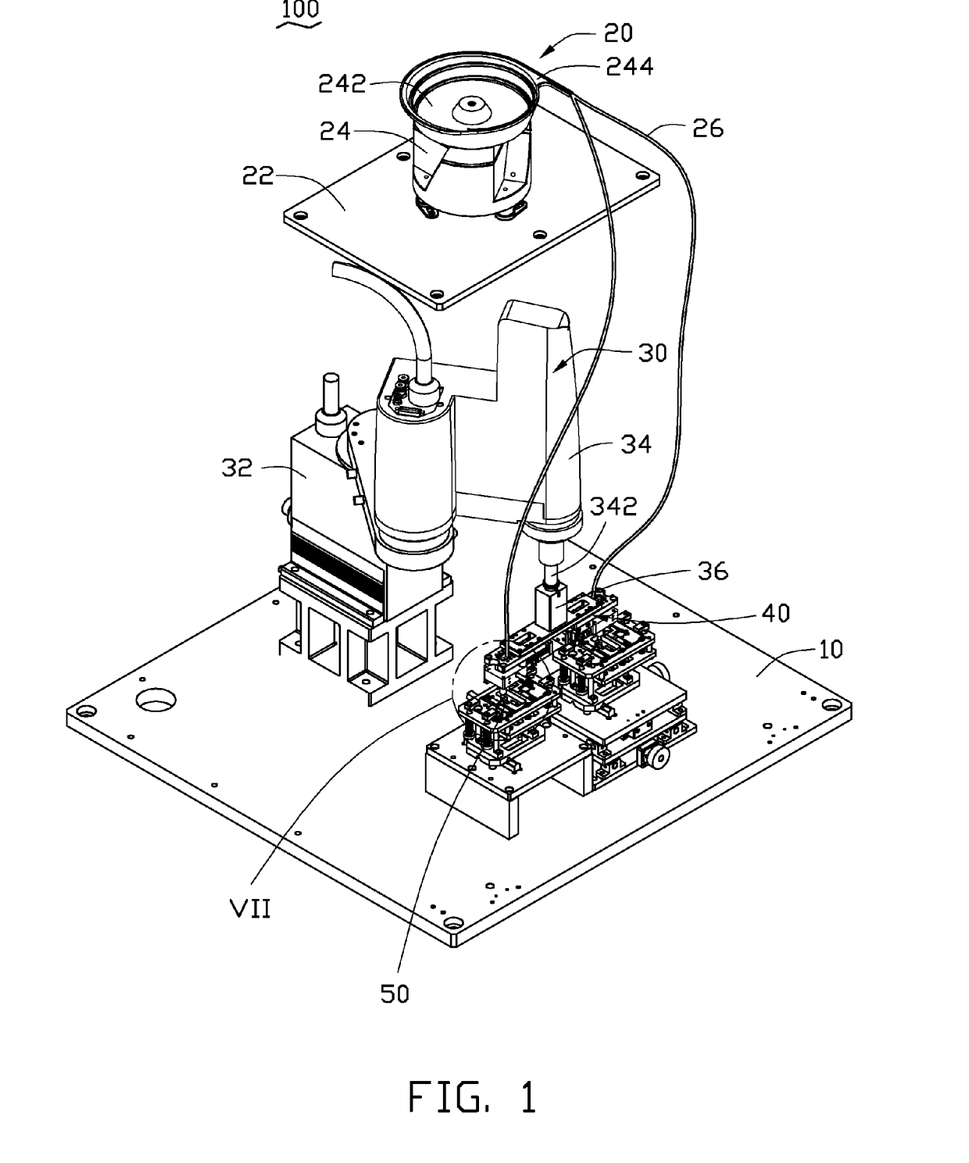
FIG. 1 is an isometric view of an exemplary embodiment of a screw assembling device.

Referring to FIG. 1, an screw assembling device 100 according to an exemplary embodiment assembles screws into housings of electronic devices. The screw assembling device 100 includes a platform 10, a supplying mechanism 20, a driving mechanism 30, an assembling mechanism 40, and a securing mechanism 50. The driving mechanism 30 and the securing mechanism 50 are located on the platform 10. The supplying mechanism 20 is located above the driving mechanism 30. The assembling mechanism 40 is located between the driving mechanism 30 and the securing mechanism 50.

The supplying mechanism 20 includes a board 22, a plurality of columns (not shown), a material provider 24, and a pair of tubes 26. The columns are disposed on the platform 10 to support the board 22. The material provider 24 includes a circular tray 242 on an upper portion thereof and a port 244 connected to a side of the tray 242. The tray 242 holds materials, such as screws. The pair of tubes 26 are connected to the tray 242 via the port 244. In use, the tray 242 vibrates at a high frequency so that materials inside the tray 242 are ejected through the port 244 and through the tubes 26 in an orderly manner.

The driving mechanism 30 is arranged between the platform 10 and the supplying mechanism 20 and includes a base 32, an arm 34, and a rotating member 36. The arm 34 is rotatably mounted to the base 32 and includes a rotating head 342 extending downward. The rotating member 36 is inverted T-shaped and is connected to the rotating head 342. The arm 34 is caused to move along an arcuate path relative to the platform 10, thus causing the rotating member 36 to move along an arcuate path relative to the platform 10.

Figure 2:
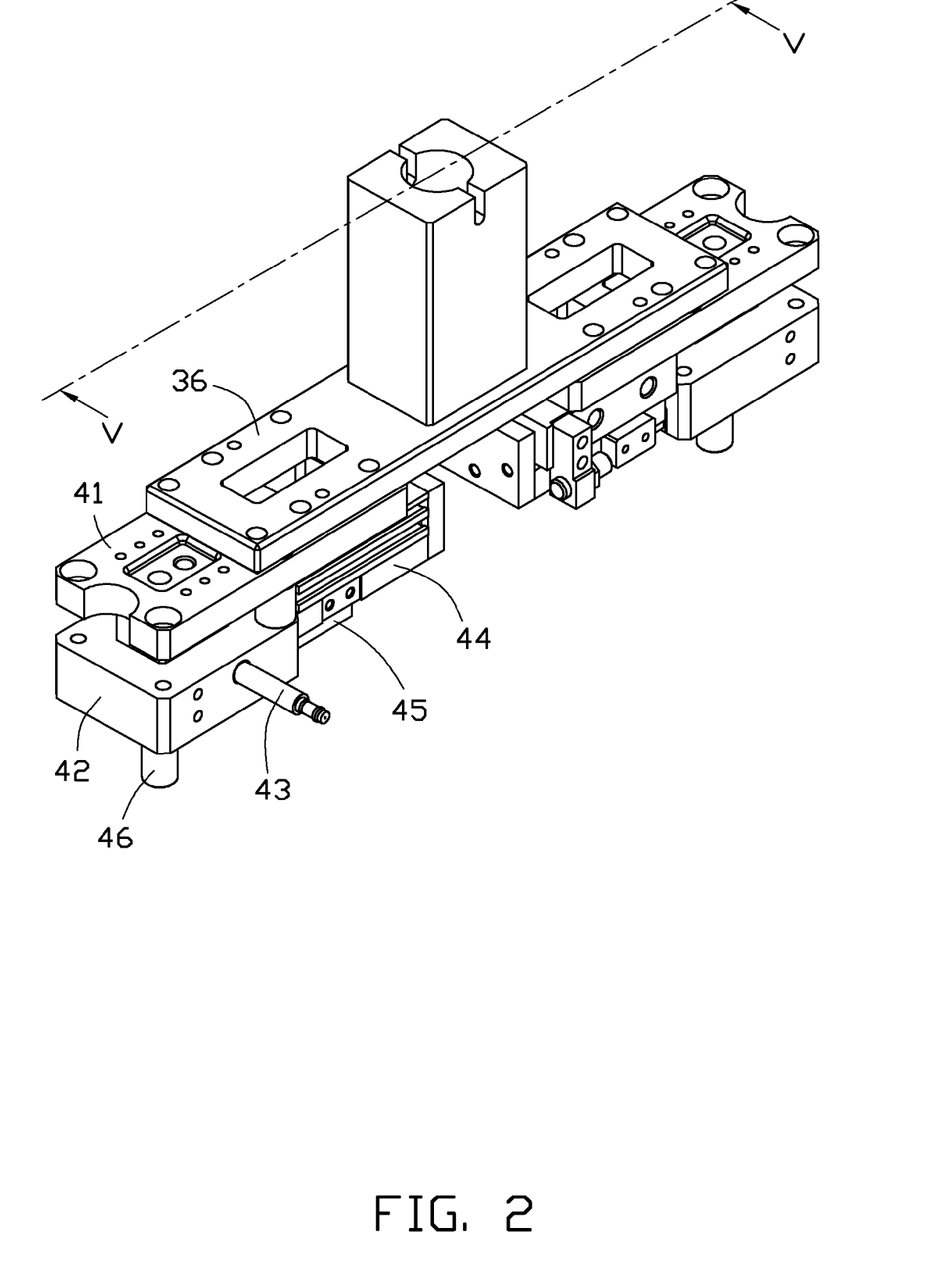
FIG. 2 is an isometric view of an assembling mechanism of the screw assembling device shown in FIG. 1.
Figure 3:
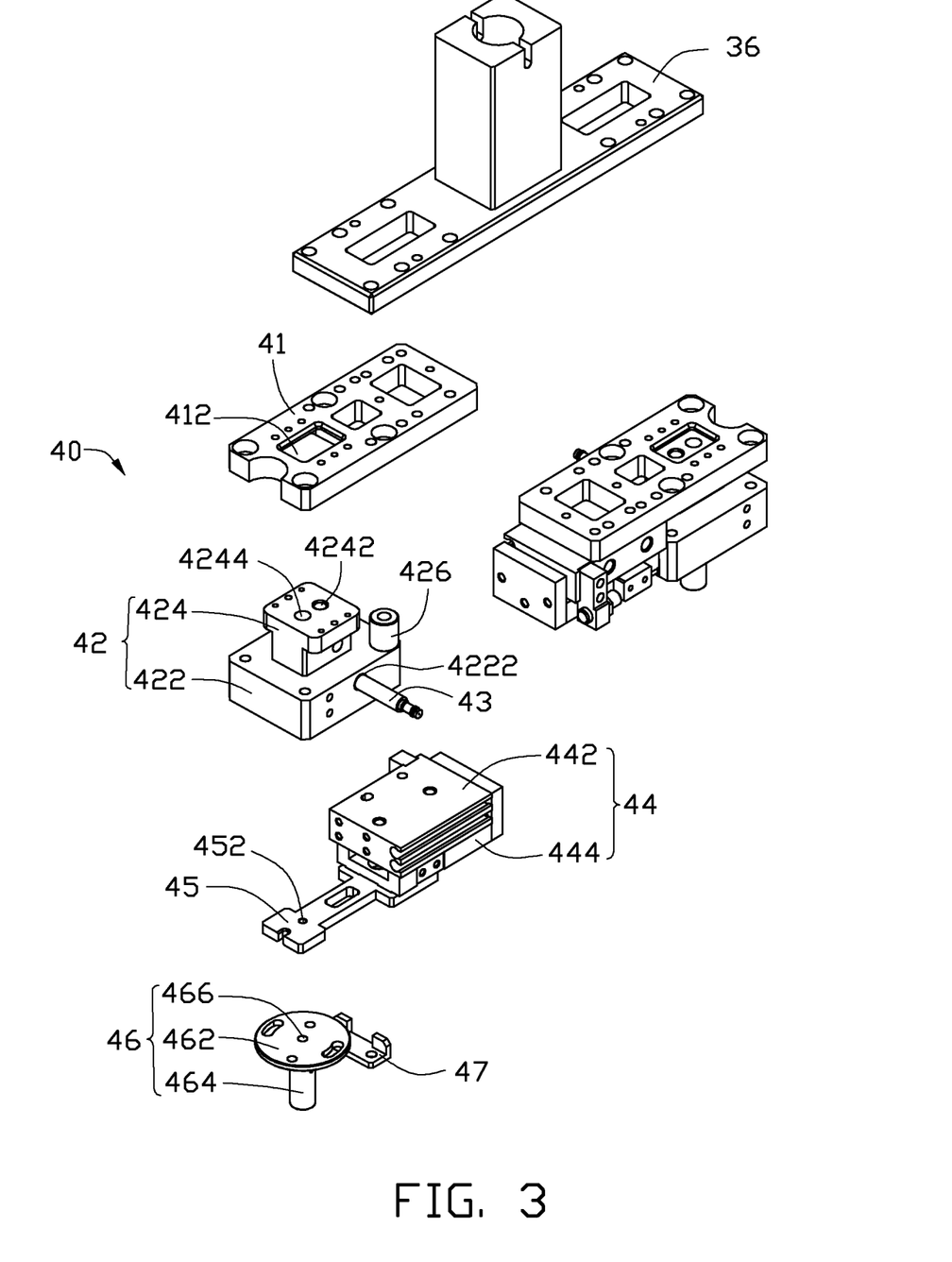
FIG. 3 is an exploded isometric view of the assembling mechanism of the screw assembling device shown in FIG. 2.
Figure 4:
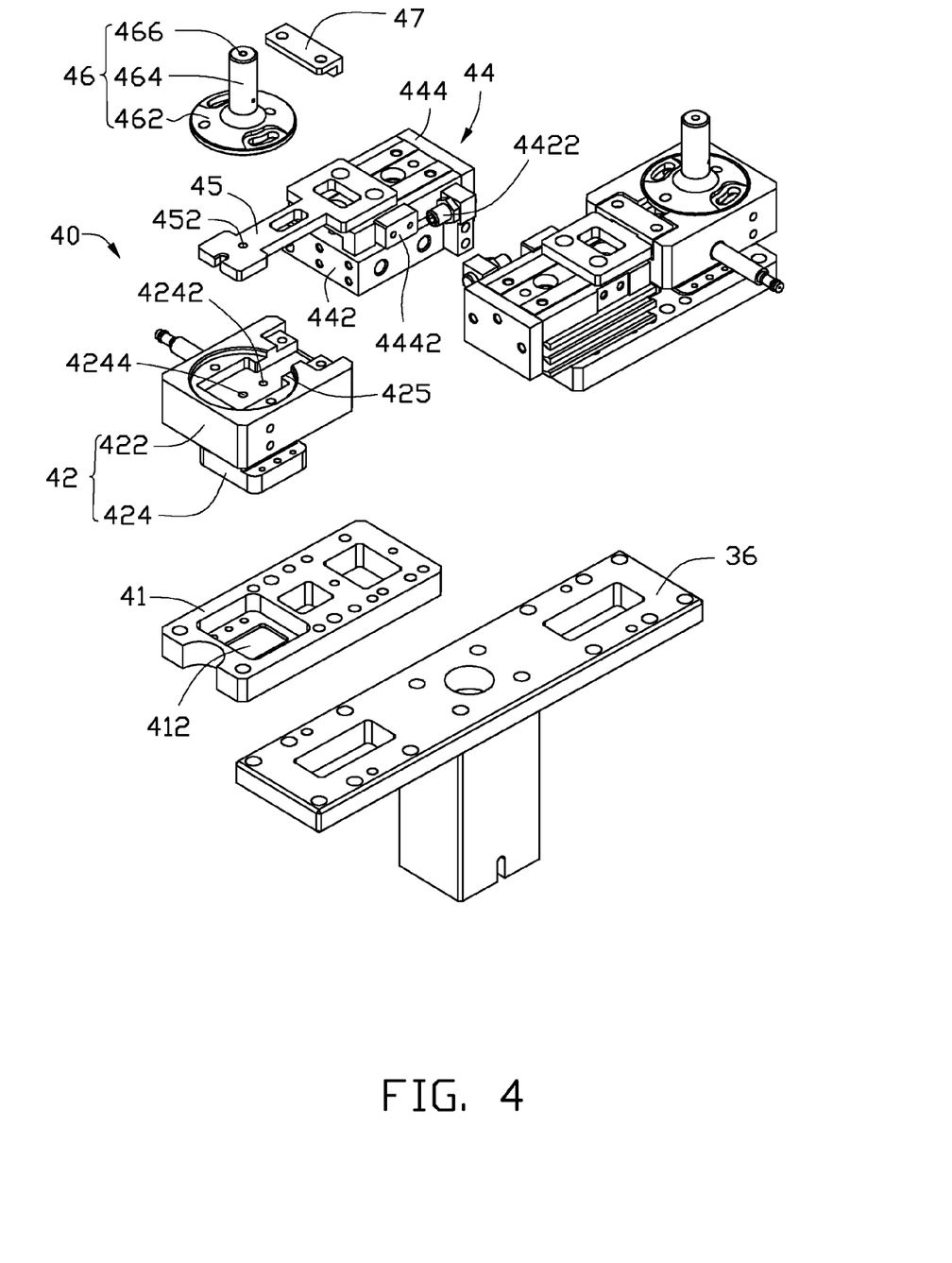
FIG. 4 is the exploded isometric view of the assembling mechanism of the screw assembling device shown in FIG. 2, but viewed from another aspect.

Also referring to FIGS. 2, 3, and 4, the assembling mechanism 40 is connected to and positioned under the rotating member 36. Therefore, the assembling mechanism 40 is driven to rotate by the rotating member 36. In the present embodiment, there are two assembling mechanisms 40. Each assembling mechanism 40 includes a connecting board 41, a delivering member 42, a blocking cylinder 43, a pushing unit 44, a pushing board 45, and an exporter 46. The connecting board 41 is connected to and positioned under the rotating member 36 and defines a first hole 412 on one end.

The delivering member 42 is connected to and positioned under the connecting board 41 and includes a lower delivering portion 422 and an upper delivering portion 424 on top of the lower delivering portion 422. The lower delivering portion 422 is rectangular solid-shaped and defines a horizontal hole 4222 configured for receiving the blocking cylinder 43. The upper delivering portion 424 is T-shaped. The delivering member 42 further includes a first vertical hole 4242 and a second vertical hole 4244 defined in the upper delivering portion 424 and the lower delivering portion 422. The two vertical holes 4242 and 4244 are positioned corresponding to the first hole 412. The first vertical hole 4242 communicates with the horizontal hole 4222. The first vertical hole 4242 receives one of the tubes 26, and configured for receiving the screws from the supplying mechanism 20. The second vertical hole 4244 receives an air tube (not shown), which is configured for supplying airflow to the second vertical hole 4244.

The lower delivering portion 422 defines a step-shaped recess 425 in a bottom surface thereof. The recess 425 includes an inner-lower-stepped portion and an outer-upper-stepped portion. The inner-lower-stepped portion of the recess 425 extends to a sidewall of the lower delivering portion 422. The outer-upper-stepped portion of the recess 425 includes a circular portion and a rectangular portion adjacent to the sidewall of the lower delivering portion 422. The delivering member 42 further includes a plurality of columns 426 surrounding the upper delivering portion 424. The columns 426 are connected between the lower delivering portion 422 and the connecting board 41.

The blocking cylinder 43 is inserted through the horizontal hole 4222 and is slidable along the horizontal hole 4222. When the blocking cylinder 43 slides to cross the first vertical hole 4242, the blocking cylinder 43 blocks the screws from moving through the first vertical hole 4242. Unblocking the first vertical hole 4242 allows the screws to pass through.

The pushing unit 44 is connected to the connecting board 41 and is positioned adjacent to the delivering member 42. The pushing unit 44 includes a fixed member 442 and a sliding member 444 slidably mounted onto the fixed member 442. A block 4422 (shown in FIG. 4) is mounted on a sidewall of the fixed member 442, and a resisting member 4442 corresponding to the block 4422 is mounted on a sidewall of the sliding member 444. The block 4422 and the resisting member 4442 limit the movement of the sliding member 444 to prevent the sliding member 444 from sliding away from the fixed member 442.

The pushing board 45 is connected to the sliding member 444 and extends into the inner-lower-stepped portion of the recess 425. The pushing board 45 defines a second hole 452, which aligns with either the first vertical hole 4242 or the second vertical hole 4244 when the pushing board 45, driven by the sliding member 444, moves along the inner-lower-stepped portion of the recess 425.

The exporter 46 includes a holding plate 462 and an exporting tube 464 extending from a central portion of the holding plate 462. The holding plate 462 is received in the circular portion of the outer-upper-stepped portion of the recess 425. The exporting tube 464 defines an exporting hole 466 aligned with the second vertical hole 4244 (see FIG. 5). A limiting member 47 is mounted to the rectangular portion of the outer-upper-stepped portion of the recess 425 and is adjacent to the exporter 46. The limiting member 47 limits the movement of the pushing board 45 when moving towards the delivering member 42.

Figure 7:
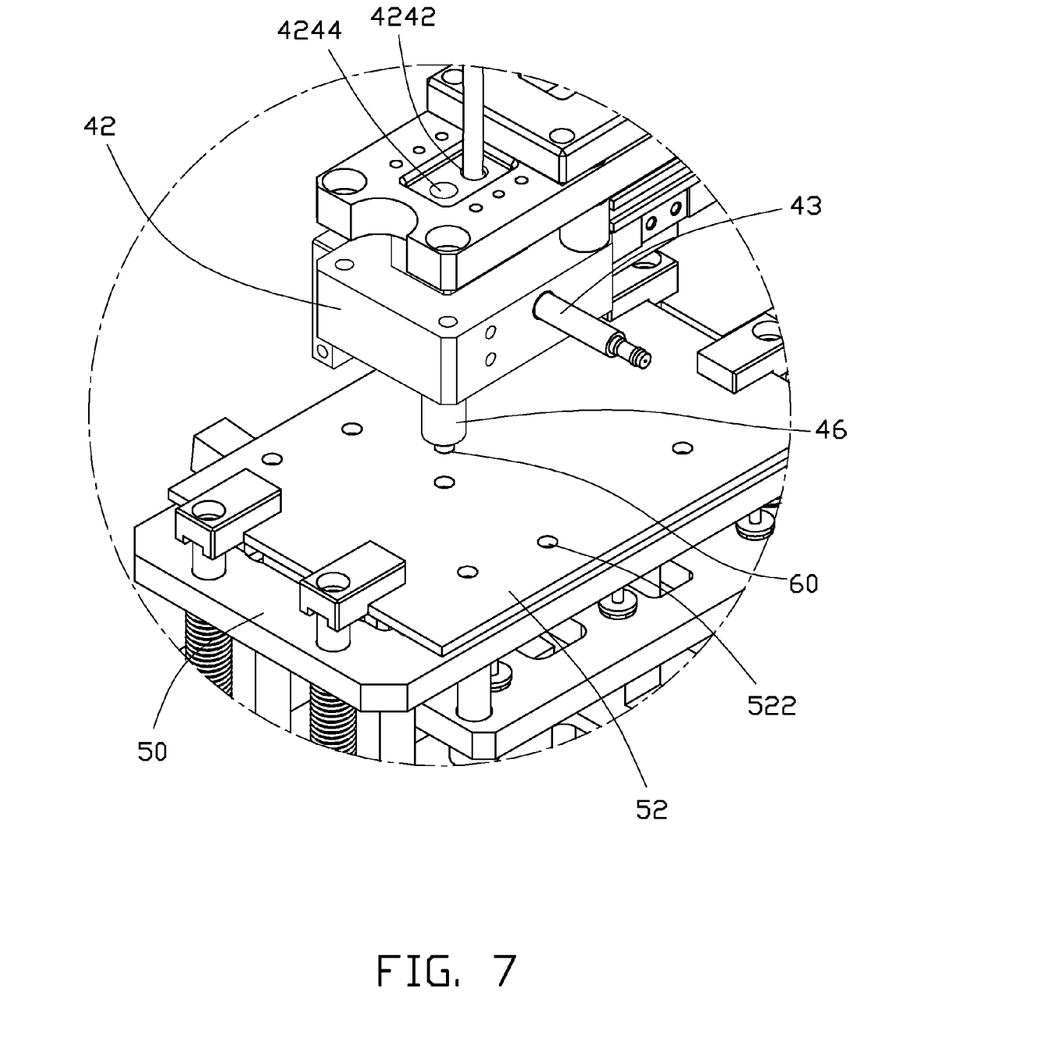
FIG. 7 is an enlarged view of a circled portion VII of FIG. 1.

Also referring to FIG. 7, the securing mechanism 50 is mounted corresponding to the assembling mechanism 40. A model 52 of a housing of an electronic device is supported on the securing mechanism 50, and a plurality of guiding holes 522 corresponding to the predetermined positions needed to be screwed to the housing of the electronic device is defined in the model 52.

Figure 5:
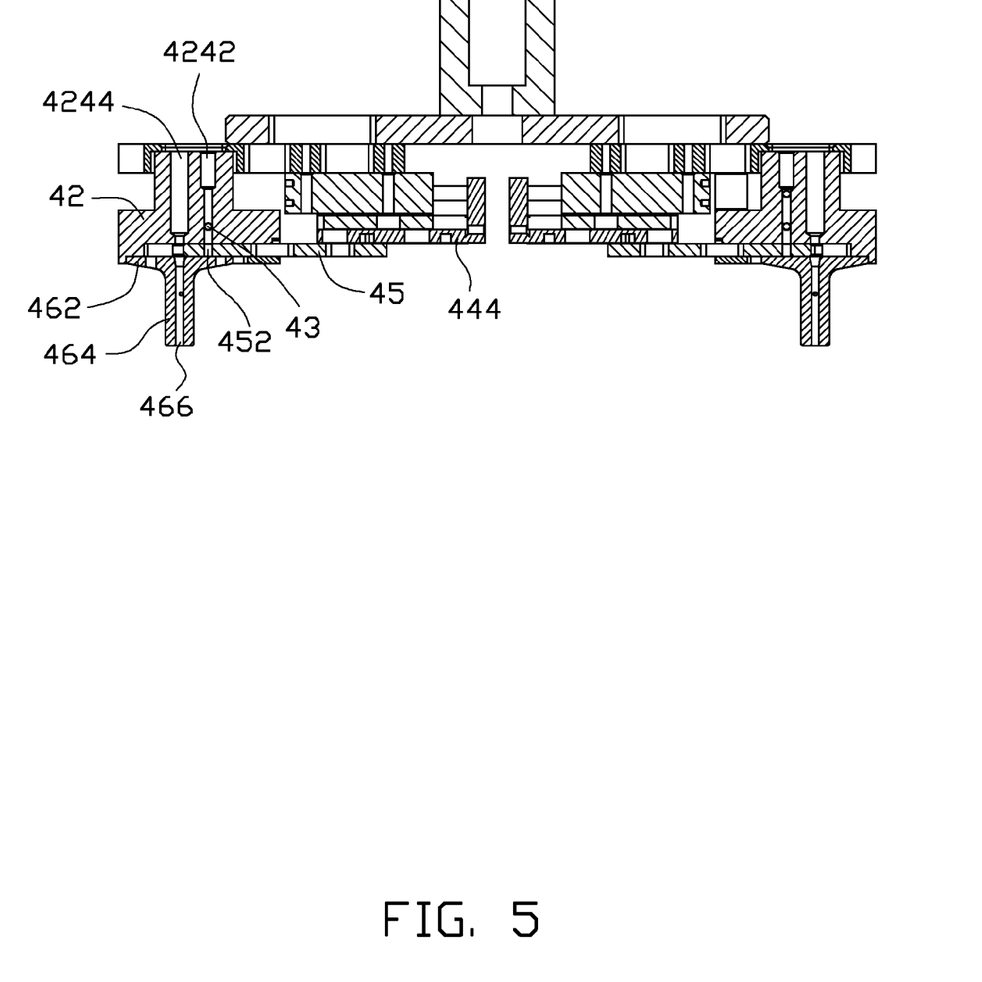
FIG. 5 is a cross-sectional view taken along line V-V of the assembling mechanism of the screw assembling device shown in FIG. 2.

Also referring to FIG. 5, an initial state of the screw assembling device 100 is shown. The blocking cylinder 43 is inserted across the first vertical hole 4242 to block the first vertical hole 4242. The second hole 452 of the pushing board 45 is aligned with the first vertical hole 4242.

Figure 6:
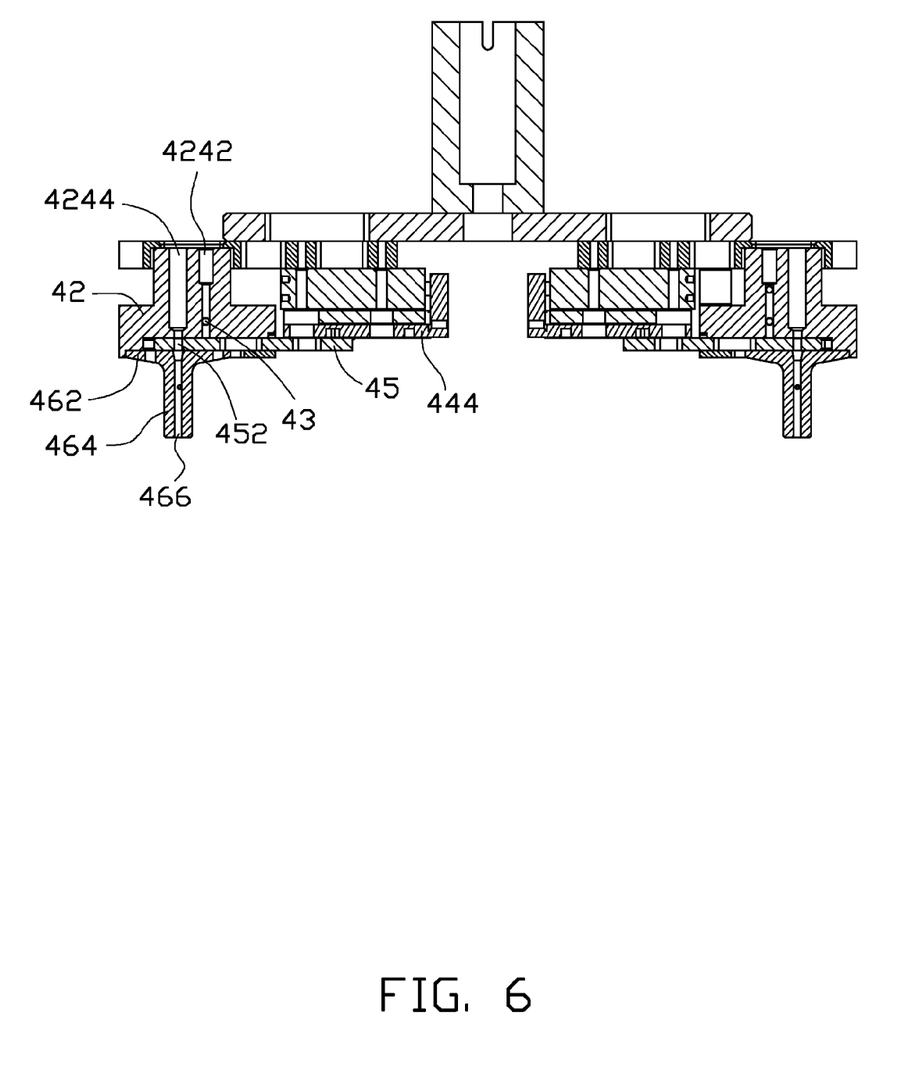
FIG. 6 is the cross-sectional view of the assembling mechanism of the screw assembling device of FIG. 5 shown in another state.

In operation of the screw assembling device 100, the arm 34 and the rotating head 342 drive the assembling mechanism 40 to make the exporting tube 464 align with the guiding holes 522 of the model 52. A plurality of screws is placed in the tray 242 of the material provider 24 and is moved into the tube 26. A screw 60 (see FIG. 7) falls down the tube 26 to the first vertical hole 4242, and the blocking cylinder 43 is moved to unblock the first vertical hole 4242. The screw 60 moves on downward to the second hole 452 and then stops on the holding plate 462. At the same time, the blocking cylinder 43 is moved back to block the next screw coming down. After that, the pushing unit 44 pushes the pushing board 45 towards the delivering member 42, making the second hole 452 align with the second vertical hole 4244 and the exporting hole 466 (see FIG. 6), and pushing the screw 60 over the exporting hole 466. The air tube generates airflow to the second vertical hole 4244, causing the screw 60 to be pushed into the exporting hole 466. Finally, the screw 60 is exported from the exporting hole 466 into the guiding hole 522. Then, the arm 34 and the rotating head 342 drive the exporting tube 464 to align with the other guiding holes 522 assemble the rest of the screws 60 orderly. Thus, the operation of assembling the screws 60 is finished.

The screw assembling device 100 assembles the screws in the predetermined positions of the housing of the electronic device orderly. The screw assembling device 100 is automated, thus saving human resource and time.

It is believed that the exemplary embodiment and its advantages will be understood from the foregoing description, and it will be apparent that various changes may be made thereto without departing from the spirit and scope of the disclosure or sacrificing all of its advantages, the examples hereinbefore described merely being preferred or exemplary embodiment of the disclosure.

What is claimed is:

1. A screw assembling device, comprising:
   a supplying mechanism, supplying a number of screws sequentially;
   a securing mechanism, holding a housing of an electronic device;
   a driving mechanism; and
   an assembling mechanism, connected to the supplying mechanism and the driving mechanism; wherein the assembling mechanism is driven by the driving mechanism to predetermined positions of the housing of electronic device and is configured for assembling the number of screws transmitted from the supplying mechanism to the predetermined positions of the housing of electronic device;
   wherein the assembling mechanism includes a delivering member, a blocking cylinder, a pushing unit, a pushing board, and an exporter, the blocking cylinder is inserted into and slidable relative to the delivering member to block the screw in the delivering member from moving through or unblock the delivering member to allow the screw to pass through, the exporter is mounted on the bottom of the delivering member to export the screws, the pushing unit is adjacent to the delivering member and connects the pushing board, the pushing board inserts between and is slidable relative to the delivering member and the exporter to receive the screw from the delivering member and deliver the screw to the exporter.

2. The screw assembling device as claimed in claim 1, further comprising a platform supporting the driving mechanism and the securing mechanism, wherein the supplying mechanism is located above the driving mechanism on the platform, the assembling mechanism is located between the driving mechanism and the securing mechanism.

3. The screw assembling device as claimed in claim 1, wherein the delivering member defines a first vertical hole and a second vertical hole adjacent to the first vertical hole, the first vertical hole is connected to the supplying mechanism via a tube, the screws on the supplying mechanism are transmitted to the first vertical hole via the tube, the second vertical hole connects an air tube.

4. The screw assembling device as claimed in claim 3, wherein the blocking cylinder is slidable across the first vertical hole, the blocking cylinder slides to cross the first vertical hole to block the screw from moving through the first vertical hole; unblocking the first vertical hole allows the screws to pass through.

5. The screw assembling device as claimed in claim 4, wherein the exporter includes a holding plate and an exporting tube, the holding plate is mounted to the bottom of the delivering member, the exporting tube is extended downward from the holding plate, the exporting tube defines an exporting hole aligned with the second vertical hole.

6. The screw assembling device as claimed in claim 5, wherein the pushing unit includes a fixed member and a sliding member slidably mounted onto the fixed member, the pushing board is connected to and driven by the sliding member.

7. The screw assembling device as claimed in claim 6, wherein a block is mounted on a sidewall of the fixed member, a resisting member is mounted on a sidewall of the sliding member corresponding to the block, the block and the resisting member limits the movement of the sliding member.

8. The screw assembling device as claimed in claim 5, wherein a limiting member is mounted on the bottom of the delivering member and adjacent to the exporter, the limiting member limits the movement of the pushing board when moving towards the delivering member.

9. The screw assembling device as claimed in claim 5, wherein the pushing board defines a first hole align with the first vertical hole, the screws from the first vertical hole fall to the holding plate via the first hole, when the pushing unit drives the pushing board move towards the delivering member, the first hole becomes aligning with the second vertical hole and the exporting hole, the screw is pushed in the first hole and aligns with the second vertical hole and the exporting hole.

10. The screw assembling device as claimed in claim 9, wherein the air tube connected to the second vertical hole generates airflow to the second vertical hole, the screw in the first hole is pushed by the airflow and passes through the exporting hole, then the screw is exported from the exporting hole and assembled to the housing of electronic device.

11. The screw assembling device as claimed in claim 10, wherein the driving mechanism includes an arm and a rotating member rotatably fixed on the arm, the rotating member holds the assembling mechanism, the arm drives the rotating member, while the rotating member drives the assembling mechanism related to the securing mechanism, thus the exporting tube of the assembling mechanism is moved to the predetermined positions of the housing of electronic device.

12. The screw assembling device as claimed in claim 11, wherein the arm includes a rotating head downward, the rotating member is an inverted T-shaped and connects to the rotating head, thus to whirls relative to the arm.

13. The screw assembling device as claimed in claim 11, wherein the assembling mechanism further includes a connecting board connected to the rotating member, the delivering member and the pushing unit are mounted downward on the connecting board.

14. The screw assembling device as claimed in claim 11, wherein there are two assembling mechanisms, which are connected to the opposite end of the rotating member.

15. The screw assembling device as claimed in claim 3, wherein the supplying mechanism includes a material provider, the material provider includes a tray holding the screws, a port is defined on a side of the tray, the port communicates the tray with the tube, the tray exports the screws to the tube via the port sequentially.

\* \* \* \* \*